(12) United States Patent  (10) Patent No.: US 8,633,658 B2
Yun  (45) Date of Patent: Jan. 21, 2014

(54) LIGHT EMITTING DEVICE MODULE AND SURFACE LIGHT SOURCE DEVICE

(75) Inventor: Sang Bok Yun, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 13/440,726

(22) Filed: Apr. 5, 2012

(65) Prior Publication Data

US 2012/0256560 A1 Oct. 11, 2012

(30) Foreign Application Priority Data

Apr. 5, 2011 (KR) ........................ 10-2011-0031117

(51) Int. Cl.
*H05B 37/02* (2006.01)

(52) U.S. Cl.
USPC .......................................................... 315/297

(58) Field of Classification Search
None
See application file for complete search history.

(56) References Cited

U.S. PATENT DOCUMENTS

| 4,298,869 | A | * | 11/1981 | Okuno | 345/82 |
| 4,329,625 | A | * | 5/1982 | Nishizawa et al. | 315/158 |
| 4,405,858 | A | * | 9/1983 | Spratte | 250/221 |
| 5,229,829 | A | * | 7/1993 | Nihei et al. | 356/4.06 |
| 6,236,036 | B1 | * | 5/2001 | Kudo et al. | 250/221 |
| 7,709,774 | B2 | * | 5/2010 | Schulz et al. | 250/205 |
| 8,410,727 | B2 | * | 4/2013 | Mizuno | 315/313 |
| 2002/0070681 | A1 | | 6/2002 | Shimizu et al. | |
| 2004/0256995 | A1 | * | 12/2004 | Takeuchi et al. | 315/169.1 |
| 2006/0082317 | A1 | * | 4/2006 | Ohwada et al. | 315/167 |
| 2006/0132052 | A1 | * | 6/2006 | Ohwada et al. | 315/169.3 |
| 2009/0026913 | A1 | * | 1/2009 | Mrakovich | 313/498 |
| 2010/0060172 | A1 | * | 3/2010 | Ikebe et al. | 315/152 |
| 2011/0084609 | A1 | * | 4/2011 | Kawaguchi et al. | 315/77 |
| 2012/0223657 | A1 | * | 9/2012 | Van De Ven | 315/297 |
| 2012/0229032 | A1 | * | 9/2012 | Van De Ven et al. | 315/151 |

FOREIGN PATENT DOCUMENTS

| KR | 10-0756723 B1 | 9/2007 |
| KR | 10-2008-0097848 A | 11/2008 |
| KR | 10-2009-0014615 A | 2/2009 |

* cited by examiner

*Primary Examiner* — Crystal L Hammond
(74) *Attorney, Agent, or Firm* — McDermott Will & Emery LLP

(57) ABSTRACT

A light emitting device package includes a package body; a first light emitting device mounted on the package body and emitting light of a particular color; a second light emitting device mounted on the package body to be adjacent to the first light emitting device, adjusting an amount of light according to a current value applied thereto to thereby control a color temperature, and emitting orange light; and a resin part sealing the first and second light emitting devices and containing at least one or more types of phosphors.

14 Claims, 4 Drawing Sheets

LIGHT EMITTING DEVICE MODULE AND SURFACE LIGHT SOURCE DEVICE

CROSS-REFERENCE TO RELATED APPLICATIONS

This application claims the priority of Korean Patent Application No. 10-2011-0031117 filed on Apr. 5, 2011, in the Korean Intellectual Property Office, the disclosure of which is incorporated herein by reference.

BACKGROUND OF THE INVENTION

1. Field of the Invention

The present invention relates to a light emitting device module and a surface light source device, and more particularly, to a light emitting device module and a surface light source device allowing for the adjustment of color temperature.

2. Description of the Related Art

In general, a light emitting device having a light emitting material contained therein emits light by converting electrical energy into light due to electron-hole recombination in compound semiconductors. Such a light emitting device is widely used as a light source of a lighting apparatus, a display apparatus and the like, and its development has been actively accelerated.

In particular, the commercialization of a cell phone key pad, a side viewer, a camera flash or the like using a GaN-based light emitting device, which has been actively developed and used in recent years, has led to the active development of a general lighting apparatus using a light emitting device. Light emitting devices conventionally utilized in small-sized, portable products are currently being applied to large-sized, high output, high efficiency products such as a backlight unit of a large TV, a headlight of a vehicle, a general lighting apparatus and the like, and accordingly, light sources satisfying the increased requirements of the corresponding products are required.

SUMMARY OF THE INVENTION

An aspect of the present invention provides a light emitting device module allowing for the adjustment of color temperature.

An aspect of the present invention also provides a surface light source device allowing for the adjustment of color temperature.

According to an aspect of the present invention, there is provided a light emitting device module including: a light emitting device package including a package body, a first light emitting device mounted on the package body and emitting light of a particular color having a peak wavelength corresponding thereto, a second light emitting device mounted on the package body to be adjacent to the first light emitting device, adjusting an amount of light according to a current value of a driving power applied thereto to thereby control a color temperature, and emitting orange light, and a resin part sealing the first and second light emitting devices and containing at least one or more types of phosphors; and a drive control unit controlling the light emitting device package and including a first driving circuit adjusting a current value applied to the first light emitting device according to an external control signal to thereby alter a color temperature, and a second driving circuit adjusting a current value applied to the second light emitting device according to an external control signal to thereby alter a color temperature.

The first light emitting device may be a blue light emitting device emitting light having a peak wavelength ranging from 400 nm to 480 nm. The second light emitting device may be a light emitting device emitting light having a peak wavelength ranging from 560 nm to 590 nm.

The phosphors of the resin part may include at least one of yellow, green and red phosphors. The phosphors of the resin part may include yellow, green and red phosphors. The phosphors of the resin part may include yellow and red phosphors.

The color temperature may range from 2,500 K to 10,000 K.

According to another aspect of the present invention, there is provided a surface light source device including: a substrate having a plurality of white light emitting device packages and one or more orange light emitting device packages arrayed thereon; and a drive control unit including a first driving circuit adjusting a current value applied to the white light emitting device packages according to an external control signal to thereby alter a color temperature and a second driving circuit adjusting a current value applied to the orange light emitting device packages according to an external control signal to thereby alter a color temperature, wherein the white light emitting device packages and the orange light emitting device packages are electrically connected to respective light emitting device packages of the same color.

The color temperature may be altered by fixing the current value of the first driving circuit and adjusting the current value of the second driving circuit. The color temperature may be altered by fixing the current value of the second driving circuit and adjusting the current value of the first driving circuit.

Each of the white light emitting device packages may include a blue light emitting device; and a resin part sealing the blue light emitting device and containing yellow and red phosphors. Each of the white light emitting device packages may include a blue light emitting device; and a resin part sealing the blue light emitting device and containing yellow, red and green phosphors.

The white light emitting device packages may emit light having a peak wavelength ranging from 400 nm to 480 nm and a color temperature ranging from 2,500 K to 10,000 K.

The orange light emitting device packages may emit light having a peak wavelength ranging from 560 nm to 590 nm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
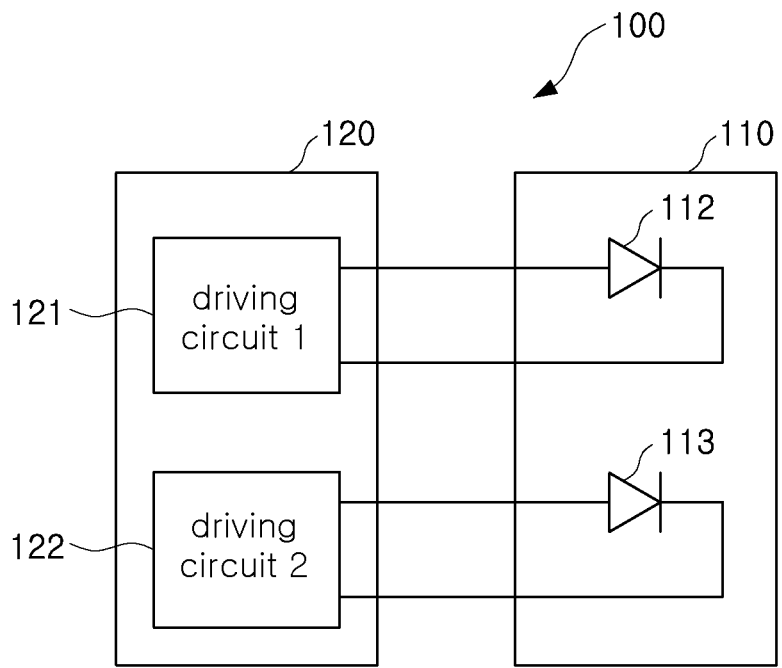
FIG. 1 is a circuit diagram of a light emitting device module according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

A light emitting device module 100 according to an embodiment of the present invention will be described below.

Figure 2:
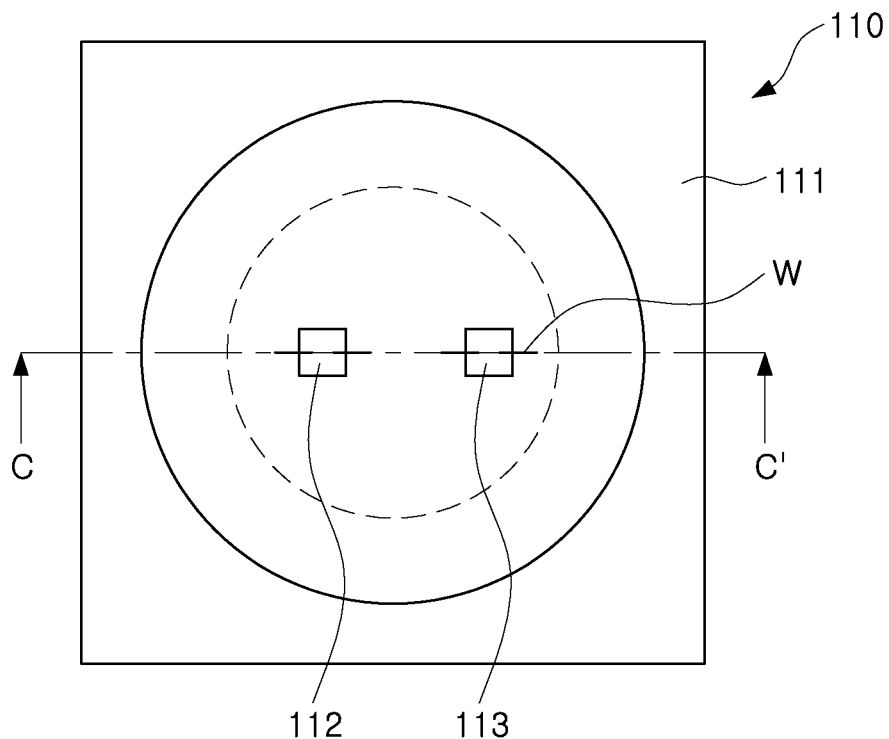
FIG. 2 is a plan view of a light emitting device package of FIG. 1.
Figure 3:
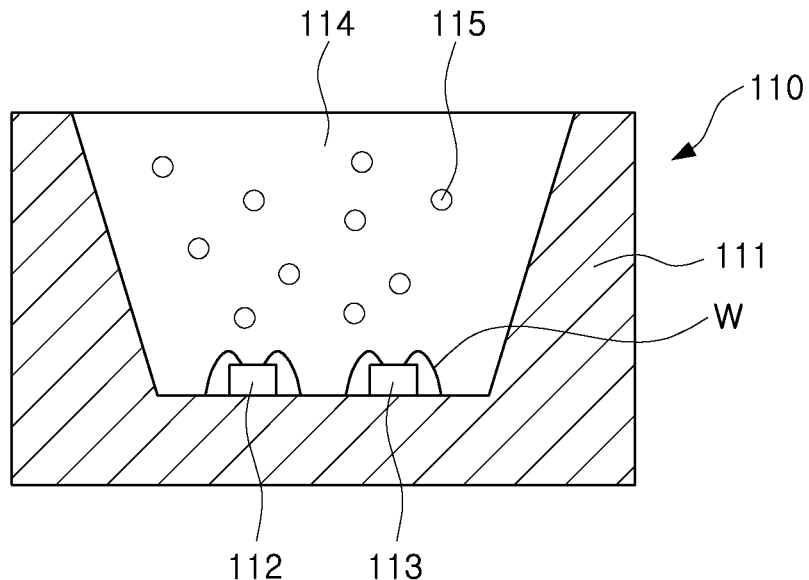
FIG. 3 is a cross-sectional view of the light emitting device package of FIG. 2, taken along line C-C'.

FIG. 1 is a circuit diagram of a light emitting device module according to an embodiment of the present invention. FIG. 2 is a plan view of a light emitting device package of FIG. 1. FIG. 3 is a cross-sectional view of the light emitting device package of FIG. 2, taken along line C-C'.

As shown in FIG. 1, the light emitting device module 100 includes a light emitting device package 110 and a drive control unit 120.

As shown in FIGS. 2 and 3, the light emitting device package 110 includes a package body 111, and first and second light emitting devices 112 and 113 mounted therein.

The package body 111 may have the first and second light emitting devices 112 and 113 mounted on a surface thereof. The mounting surface, on which the first and second light emitting devices 112 and 113 are mounted, may be a surface of a concave portion, edges of which meet inclined surfaces disposed therearound.

The first and second light emitting devices 112 and 113 may employ a photoelectric device emitting light when an electrical signal is applied thereto. A semiconductor light emitting diode (LED) chip formed by epitaxially growing semiconductor layers on a growth substrate may be a representative light emitting device. A growth substrate formed of sapphire may be employed. Without being limited thereto, a known growth substrate formed of spinel, SiC, GaN, GaAs or the like may be used therefor. Specifically, the first and second light emitting devices 112 and 113 may be formed of BN, SiC, ZnSe, GaN, InGaN, InAlGaN, AlGaN, BAlGaN, BInAlGaN or the like and doped with Si or Zn. Also, an active layer of the first and second light emitting devices 112 and 113 may be formed of a nitride semiconductor of $In_xAl_yGa_{1-x-y}$ ($0 \leq K \leq 1, 0 \leq Y \leq 1, 0 \leq X+Y \leq 1$), and may have a single-quantum-well (SQW) structure or a multi-quantum-well (MQW) structure to enhance output.

As shown in FIGS. 2 and 3, electrodes (not shown) formed on the upper surfaces of the first and second light emitting devices 112 and 113 may be wire-bonded to lead frames (not shown) on the package body 111 such that they may receive electrical signals from the outside. In the present embodiment, two electrodes formed on the upper surfaces of the first and second light emitting devices 112 and 113 are wire-bonded to the lead frames. However, the invention is not limited thereto. The first and second light emitting devices 112 and 113 may be directly connected to a lead frame provided as a mounting area therefor without using a wire, and may be connected to a lead frame which is not provided as the mounting area using a conductive wire. The connection method therebetween may be varied. In the present embodiment, the two light emitting devices 112 and 113 are provided in the package body 111; however, three or more light emitting devices may be provided therein.

The first light emitting device 112 may employ a light emitting device emitting light to be converted into white light by phosphors. For example, a blue light emitting device emitting light having a peak wavelength ranging from 400 nm to 480 nm may be used.

Also, the second light emitting device 113 may employ a light emitting device emitting orange light. For example, an orange light emitting device emitting light having a peak wavelength ranging from 560 nm to 590 nm may be used.

A resin part 114 may seal the first and second light emitting devices 112 and 113 therein, and the material thereof is not particularly limited so long as it may have a light transmission property. An insulating resin having a light transmission property such as a silicone resin composition, a modified silicone resin composition, an epoxy resin composition, a modified epoxy resin composition, an acrylic resin composition or the like may be used therefor. Also, a resin having superior weather resistivity such as a hybrid resin containing at least one of silicone, epoxy and fluorine may be used. Without being limited to an organic material, the material of the resin part 114 may be an inorganic material having superior light resistivity such as glass, silica gel or the like.

The surface shape of the resin part 114 may be adjusted to control light distribution. Specifically, it may have a convex lens shape, a concave lens shape, an oval lens shape or the like, such that the distribution of light emitted from the first and second light emitting devices 112 and 113 may be controlled.

Here, the resin part 114 may include at least one or more types of phosphors. The phosphors may convert light to have any one of yellow, red and green wavelengths. The types of phosphors may be determined by the wavelength of light emitted from the active layer of the first and second light emitting devices 112 and 113. Specifically, the phosphors may include at least one of YAG-based phosphors, TAG-based phosphors, silicate-based phosphors, sulfide-based phosphors and nitride-based phosphors. For example, the resin part 114 converting blue light into white light may be formed by applying phosphors for converting light to have yellow and red wavelengths to a blue light emitting device or applying phosphors for converting light to have yellow, green and red wavelengths to a blue light emitting device.

The drive control unit 120 may include first and second driving circuits 121 and 122 causing at least one of the first and second light emitting devices 112 and 113 to be selectively driven according to an external control signal. Here, the drive control unit 120 may have an integrated circuit (IC), in which various circuits are integrated, and peripheral circuits around the IC.

The first driving circuit 121 may cause the first light emitting device 112 to be turned-on according to an external control signal, and control a current value applied to the turned-on first light emitting device 112 to alter a color temperature.

The second driving circuit 122 may cause the second light emitting device 113 to be turned-on according to an external control signal, and control a current value applied to the turned-on second light emitting device 113 to alter a color temperature.

The drive control unit 120 may apply current values fixed at the time of manufacturing the light emitting device module 100 to the light emitting devices, or may control current values according to a user's intention to adjust color temperatures.

Here, the first and second driving circuits 121 and 122 may cause a color temperature of light emitted from the first and second light emitting devices 112 and 113 to range from 2,500 K to 10,000 K.

In the light emitting device module 100 having the above-described configuration, when current is applied to the first and second light emitting devices 112 and 113, light is emitted therefrom, and a color temperature of the emitted light may be altered by controlling a current value applied to the first or second light emitting device 112 or 113.

Figure 4:
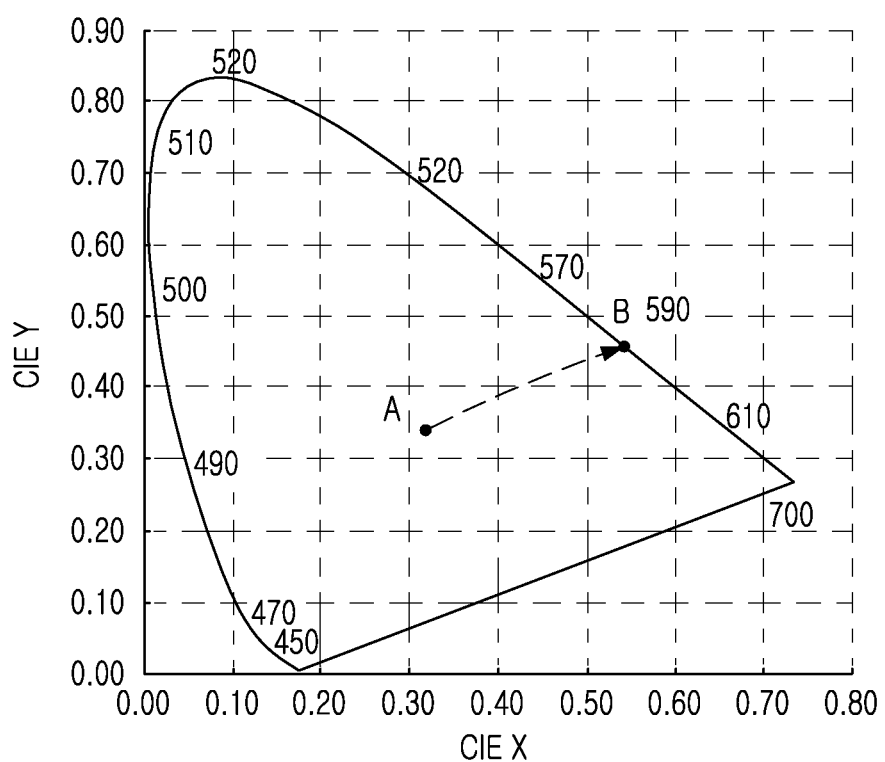
FIG. 4 is a chromaticity diagram showing the color temperature characteristics of a light emitting device module according to an embodiment of the present invention.
Figure 5:
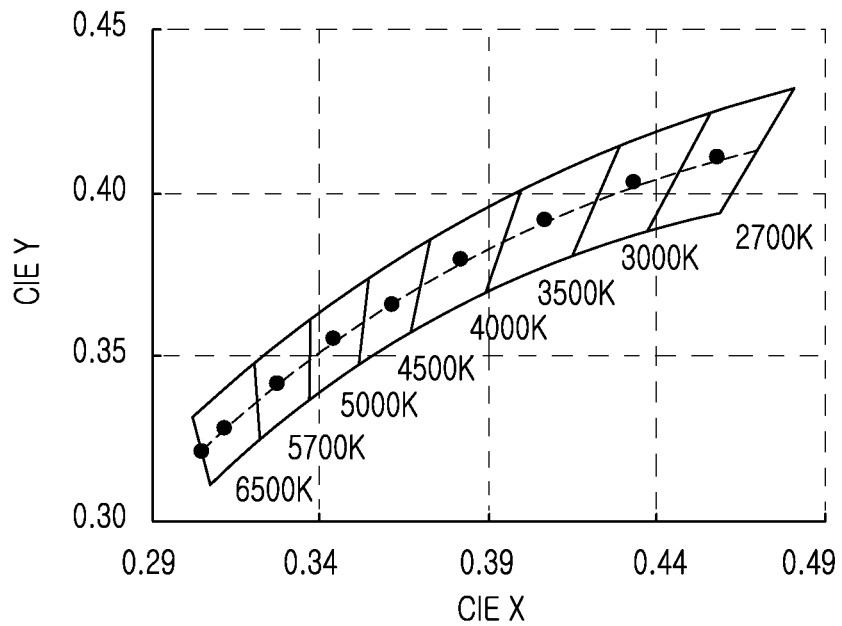
FIG. 5 is a chromaticity diagram showing color temperature changes in a light emitting device module according to an embodiment of the present invention.

With reference to FIGS. 4 and 5, in a case in which a blue light emitting device emitting light having a peak wavelength ranging from 400 nm to 480 nm is employed as the first light emitting device 112, when current is applied thereto, white light A is emitted therefrom by passing through the (yellow, green and red) phosphors of the resin part. Here, the white light A has a color temperature of approximately 6,000 K. Thereafter, when current is applied to the second light emitting device 113, orange light is emitted therefrom. As the current applied thereto is increased, the amount of emitted orange light is increased. The color temperature of light emitted from the light emitting device module 100 is gradually reduced, such that white light B having improved color rendering may be emitted. The color temperature may be varied, without being limited to the above-mentioned temperature value.

In this manner, when a current value applied to the respective first and second light emitting devices 112 and 113 is adjusted to thereby control the amount of light thereof, white light having a variety of color temperatures may be created. As shown in FIG. 5, reviewing the relationships between the amount of light of the first and second light emitting devices 112 and 113 and that of light emitted from the light emitting device module 100, as the amount of light of the second light emitting device 113 is increased, the color temperature is reduced, and as the amount of light of the first light emitting device 112 is reduced, the color temperature is reduced.

Hereinafter, a surface light source device 200 according to an embodiment of the present invention will be described in detail.

Figure 6:
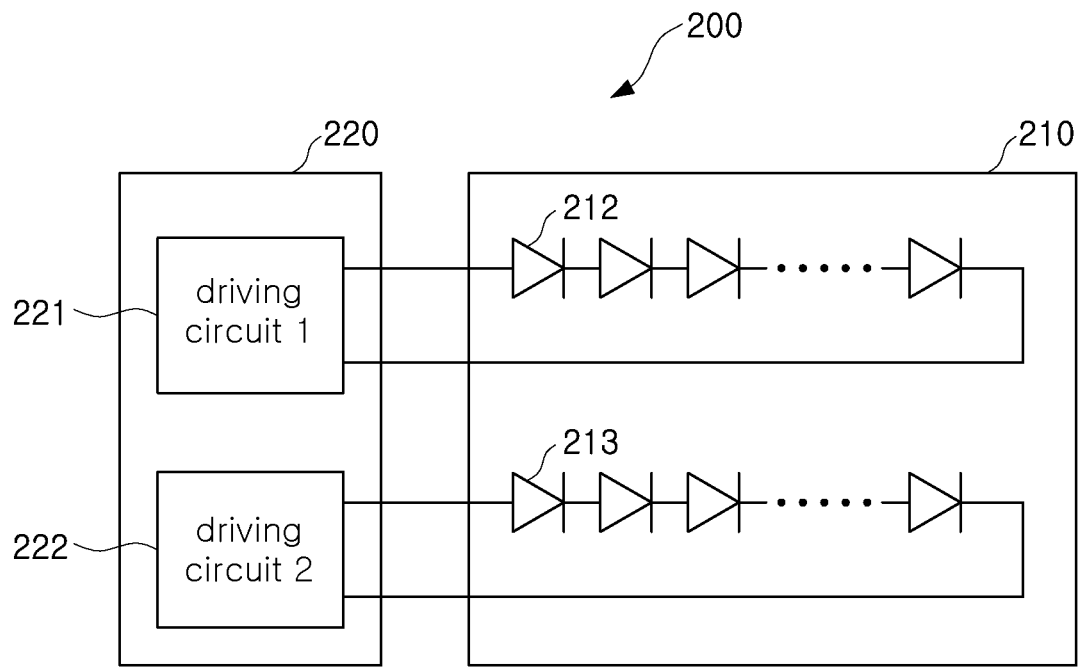
FIG. 6 is a circuit diagram of a surface light source device according to an embodiment of the present invention.
Figure 7:
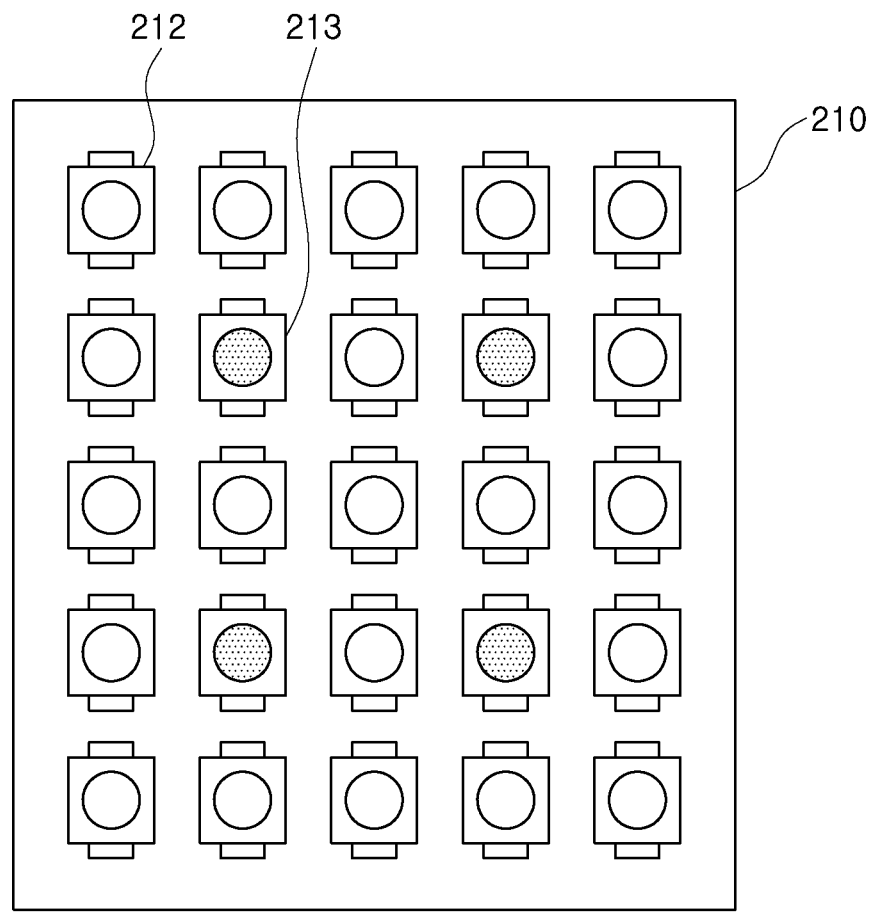
FIG. 7 is a plan view of a surface light source device according to an embodiment of the present invention.

FIG. 6 is a circuit diagram of a surface light source device according to an embodiment of the present invention. FIG. 7 is a plan view of a surface light source device according to an embodiment of the present invention.

As shown in FIG. 6, the surface light source device 200 according to this embodiment may include a substrate 210 and a drive control unit 220.

The substrate 210 has white and orange light emitting device packages 212 and 213 arrayed thereon.

A plurality of white light emitting device packages 212 may be arrayed on the substrate 210 and at least one orange light emitting device package 213 may be arrayed thereon. Here, the white and orange light emitting device packages 212 and 213 may be arrayed in various forms such as a lattice form, a concentric form or the like. The white light emitting device packages 212 may be arrayed to surround the at least one orange light emitting device package 213. In FIG. 7, the white and orange light emitting device packages 212 and 213 are arrayed on the substrate 210 in a 5×5 lattice form, and the at least one orange light emitting device package 213 is surrounded by the white light emitting device packages 212.

The white light emitting device package 212 may include a blue light emitting device emitting light to be converted into white light by phosphors and a resin part including the phosphors. Specifically, a blue light emitting device emitting light having a peak wavelength ranging from 400 nm to 480 nm and a resin part sealing the blue light emitting device and including yellow and red phosphors may be used. Here, a color temperature of light emitted from the white light emitting device package 212 may range from 2,500 K to 10,000 K.

The orange light emitting device package 213 may include an orange light emitting device emitting light to be converted into white light by phosphors and a resin part including the phosphors. Specifically, an orange light emitting device emitting light having a peak wavelength ranging from 560 nm to 590 nm and a resin part sealing the orange light emitting device and including yellow, red and green phosphors may be used.

The drive control unit 220 may include a first driving circuit 221 causing the white light emitting device package 212 to be turned-on according to an external control signal and controlling a current value applied to the turned-on white light emitting device package 212 to thereby alter a color temperature, and a second driving circuit 222 causing the orange light emitting device package 213 to be turned-on according to an external control signal and controlling a current value applied to the turned-on orange light emitting device package 213 to thereby alter a color temperature.

The white and orange light emitting device packages 212 and 213 may individually form an electrically connected group of light emitting device packages having the same color. At least two electrically connected groups, i.e., a white light emitting device package group and an orange light emitting device package group may be formed. The plurality of electrically connected groups emitting light of the same color may be connected in parallel, such that they may be driven by the respective driving circuits 221 and 222.

In a case in which the first and second driving circuits 221 and 222 apply current to the respective white and orange light emitting device packages 212 and 213 according to external control signals, the surface light source device 200 emits white light. The first and second driving circuits 221 and 222 may adjust current values according to the external control signals to control the amount of light of the individual light emitting device packages 212 and 213, such that the color temperature of light emitted from the surface light source device 200 may be adjusted.

The color temperature of light emitted from the surface light source device 200 may be adjusted by fixing a current value of the first driving circuit 221 and adjusting a current value of the second driving circuit 222 according to an external control signal, or by fixing a current value of the second driving circuit 222 and adjusting a current value of the first driving circuit 221.

As set forth above, according to embodiments of the invention, a light emitting device module and a surface light source device allowing for the adjustment of color temperature, such that they may be allowed to create a color temperature suitable for usage, irrespective of a deviation in individual devices or a change in manufacturing processes.

While the present invention has been shown and described in connection with the embodiments, it will be apparent to those skilled in the art that modifications and variations can be made without departing from the spirit and scope of the invention as defined by the appended claims.

What is claimed is:

1. A light emitting device module comprising:
   a light emitting device package including:
      a package body;
      a first light emitting device mounted on the package body and emitting light of a particular color having a peak wavelength corresponding thereto;
      a second light emitting device mounted on the package body to be adjacent to the first light emitting device, adjusting an amount of light according to a current value of a driving power applied thereto to thereby control a color temperature, and emitting orange light; and a resin part sealing the first and second light emitting devices and containing at least one or more types of phosphors; and a drive control unit controlling the light emitting device package, the drive control unit including:

a first driving circuit adjusting a current value applied to the first light emitting device according to an external control signal to thereby alter a color temperature; and a second driving circuit adjusting a current value applied to the second light emitting device according to an external control signal to thereby alter a color temperature.

2. The light emitting device module of claim 1, wherein the first light emitting device is a blue light emitting device emitting light having a peak wavelength ranging from 400 nm to 480 nm.

3. The light emitting device module of claim 1, wherein the second light emitting device is a light emitting device emitting light having a peak wavelength ranging from 560 nm to 590 nm.

4. The light emitting device module of claim 1, wherein the phosphors of the resin part comprise at least one of yellow, green and red phosphors.

5. The light emitting device module of claim 4, wherein the phosphors of the resin part comprise yellow, green and red phosphors.

6. The light emitting device module of claim 4, wherein the phosphors of the resin part comprise yellow and red phosphors.

7. The light emitting device module of claim 1, wherein the color temperature ranges from 2,500 K to 10,000 K.

8. A surface light source device comprising:

a substrate having a plurality of white light emitting device packages and one or more orange light emitting device packages arrayed thereon; and a drive control unit including a first driving circuit adjusting a current value applied to the white light emitting device packages according to an external control signal to thereby alter a color temperature and a second driving circuit adjusting a current value applied to the orange light emitting device packages according to an external control signal to thereby alter a color temperature, wherein the white light emitting device packages and the orange light emitting device packages are electrically connected to respective light emitting device packages of the same color.

9. The surface light source device of claim 8, wherein the color temperature is altered by fixing the current value of the first driving circuit and adjusting the current value of the second driving circuit.

10. The surface light source device of claim 8, wherein the color temperature is altered by fixing the current value of the second driving circuit and adjusting the current value of the first driving circuit.

11. The surface light source device of claim 8, wherein each of the white light emitting device packages comprises:

a blue light emitting device; and a resin part sealing the blue light emitting device and containing yellow and red phosphors.

12. The surface light source device of claim 8, wherein each of the white light emitting device packages comprises:

a blue light emitting device; and a resin part sealing the blue light emitting device and containing yellow, red and green phosphors.

13. The surface light source device of claim 8, wherein the white light emitting device packages emit light having a peak wavelength ranging from 400 nm to 480 nm and a color temperature ranging from 2,500 K to 10,000 K.

14. The surface light source device of claim 8, wherein the orange light emitting device packages emit light having a peak wavelength ranging from 560 nm to 590 nm.

* * * * *